(12) United States Patent
Nagasawa

(10) Patent No.: US 8,101,504 B2
(45) Date of Patent: Jan. 24, 2012

(54) SEMICONDUCTOR CHIP FABRICATION METHOD

(75) Inventor: Tadato Nagasawa, Ota-Ku (JP)

(73) Assignee: Disco Corporation, Tokyo (JP)

( * ) Notice: Subject to any disclaimer, the term of this patent is extended or adjusted under 35 U.S.C. 154(b) by 430 days.

(21) Appl. No.: 12/388,288

(22) Filed: Feb. 18, 2009

(65) Prior Publication Data

US 2009/0209088 A1    Aug. 20, 2009

(30) Foreign Application Priority Data

Feb. 20, 2008  (JP) ................... 2008-038419

(51) Int. Cl.
*H01L 21/78* (2006.01)
(52) U.S. Cl. ....................... 438/463; 438/113
(58) Field of Classification Search ............ 438/462
See application file for complete search history.

(56) References Cited

U.S. PATENT DOCUMENTS

| | | | | |
|---|---|---|---|---|
| 7,807,507 B2 * | 10/2010 | Kim et al. | ...................... | 438/113 |
| 2007/0275543 A1 * | 11/2007 | Abe et al. | ...................... | 438/464 |
| 2008/0153264 A1 * | 6/2008 | Nakamura et al. | ............ | 438/463 |
| 2008/0233712 A1 * | 9/2008 | Sekiya | ......................... | 438/462 |

FOREIGN PATENT DOCUMENTS

JP    B2 3408805    7/2002

* cited by examiner

*Primary Examiner* — Zandra Smith
*Assistant Examiner* — Pamela E Perkins
(74) *Attorney, Agent, or Firm* — Greer, Burns & Crain, Ltd.

(57) ABSTRACT

A semiconductor chip fabrication method including a modified layer forming step of applying a laser beam having a transmission wavelength to the semiconductor wafer from the back side of the semiconductor wafer along the streets formed on the front side of the semiconductor wafer so that a focal point of the laser beam is set inside the semiconductor wafer, thereby forming a modified layer in the semiconductor wafer along each street, a metal film deposition step of depositing a metal film on the back side of the semiconductor wafer after the modified layer forming step, a semiconductor wafer attaching step of attaching the semiconductor wafer to an adhesive tape supported to an annular frame, and a semiconductor wafer dividing step of applying an external force to the semiconductor wafer in the condition where the semiconductor wafer is attached to the adhesive tape to thereby divide the semiconductor wafer with the metal film into the individual semiconductor chips along the modified layer formed along each street.

4 Claims, 10 Drawing Sheets

SEMICONDUCTOR CHIP FABRICATION METHOD

BACKGROUND OF THE INVENTION

1. Field of the Invention

The present invention relates to a semiconductor chip fabrication method for dividing a semiconductor wafer into individual semiconductor chips (devices) along a plurality of crossing streets formed on the front side of the semiconductor wafer, wherein the devices are respectively formed in a plurality of regions partitioned by the streets and the back side of the semiconductor wafer is coated with a metal film.

2. Description of the Related Art

A plurality of devices such as ICs and LSIs are formed on the front side of a semiconductor wafer. The back side of the semiconductor wafer is ground to obtain a desired thickness of the semiconductor wafer. Thereafter, the semiconductor wafer is divided along a plurality of crossing streets (division lines) to obtain the individual semiconductor chips, which are used in various electronic equipment. In general, the semiconductor wafer is divided into the individual semiconductor chips by a dicing method for cutting the semiconductor wafer along the streets by using a cutting blade having a thickness of about 20 to 40 μm or by a laser processing method using a pulsed laser beam having a transmission wavelength to the semiconductor wafer.

In the laser processing method using a pulsed laser beam having a transmission wavelength to the semiconductor wafer, the pulsed laser beam is applied to the semiconductor wafer along the streets in the condition where a focal point of the pulsed laser beam is set inside the semiconductor wafer, thereby continuously forming a modified layer inside the semiconductor wafer along each street. By forming the modified layer along each street, the strength of the semiconductor wafer along the modified layer is reduced. Accordingly, by applying an external force to the semiconductor wafer along each street, the semiconductor wafer can be divided along each street to obtain the individual semiconductor chips (see Japanese Patent No. 3408805, for example). In the case that devices such as power transistors are formed on the front side of the semiconductor wafer, the back side of the semiconductor wafer is generally coated with a metal film such as a gold, silver, or titanium film having a thickness of several nanometers as a ground.

However, when such a semiconductor wafer having a metal film on the back side is cut by using a cutting blade of a dicing apparatus, burrs are left on the periphery of each semiconductor chip on the back side thereof because of the toughness of the metal film. Furthermore, there is another problem that metal dust or contamination may adhere to the cutting blade to cause clogging of the cutting blade, resulting in a short life of the cutting blade. On the other hand, in the laser processing method using a pulsed laser beam having a transmission wavelength to the semiconductor wafer, a modified layer cannot be formed inside the metal film because the laser beam is not transmitted through the metal film.

In general, examples of a metal processing method using a laser beam include a method of focusing a laser beam on the surface of metal to thereby melt the metal at the focal point and a method called ablation for evaporating the metal or generating a plasma. However, in both methods, processing dust or contamination called melt residues or debris is generated, so that these methods are not suitable for the fabrication of semiconductor chips required to avoid such processing dust or contamination.

SUMMARY OF THE INVENTION

It is therefore an object of the present invention to provide a semiconductor chip fabrication method which can divide a semiconductor wafer having a metal film on the back side into the individual semiconductor chips efficiently without the generation of processing dust or contamination.

In accordance with an aspect of the present invention, there is provided a semiconductor chip fabrication method for dividing a semiconductor wafer into individual semiconductor chips, the semiconductor wafer having a device area and a marginal area surrounding the device area, the device area being composed of a plurality of regions partitioned by a plurality of crossing streets formed on the front side of the semiconductor wafer, wherein the semiconductor chips as devices are respectively formed in the plurality of regions of the device area, the semiconductor chip fabrication method including a modified layer forming step of applying a laser beam having a transmission wavelength to said semiconductor wafer from the back side of the semiconductor wafer along the streets so that a focal point of the laser beam is set inside the semiconductor wafer, thereby forming a modified layer in the semiconductor wafer along each street; a metal film deposition step of depositing a metal film on the back side of the semiconductor wafer after the modified layer forming step; a semiconductor wafer attaching step of attaching the semiconductor wafer to an adhesive tape supported to an annular frame; and a semiconductor wafer dividing step of applying an external force to the semiconductor wafer in the condition where the semiconductor wafer is attached to the adhesive tape to thereby divide the semiconductor wafer with the metal film into the individual semiconductor chips along the modified layer formed along each street.

Preferably, the semiconductor wafer dividing step is performed by expanding the adhesive tape to thereby apply a tensile force to the semiconductor wafer attached to the adhesive tape, so that the semiconductor wafer is divided along the modified layer. Preferably, the semiconductor chip fabrication method further includes the step of grinding the back side of said semiconductor wafer at a central portion corresponding to said device area prior to said modified layer forming step, thereby forming a ringlike projection corresponding to said marginal area on the back side of said semiconductor wafer.

According to the present invention, the modified layer is formed inside the semiconductor wafer along each street by applying the laser beam. Thereafter, the metal film as a ground is formed on the back side of the semiconductor wafer. Thereafter, the semiconductor wafer with the metal film is divided into the individual semiconductor chips along the modified layer formed along each street. Accordingly, although the metal film as a ground is formed on the back side of the semiconductor wafer, the semiconductor wafer can be divided into the individual semiconductor chips efficiently without the generation of processing dust or contamination. Further, as compared with a method of cutting a semiconductor wafer along each street as by dicing using a cutting blade, the ratio in area of all the streets to the device area can be reduced to thereby improve the production efficiency.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
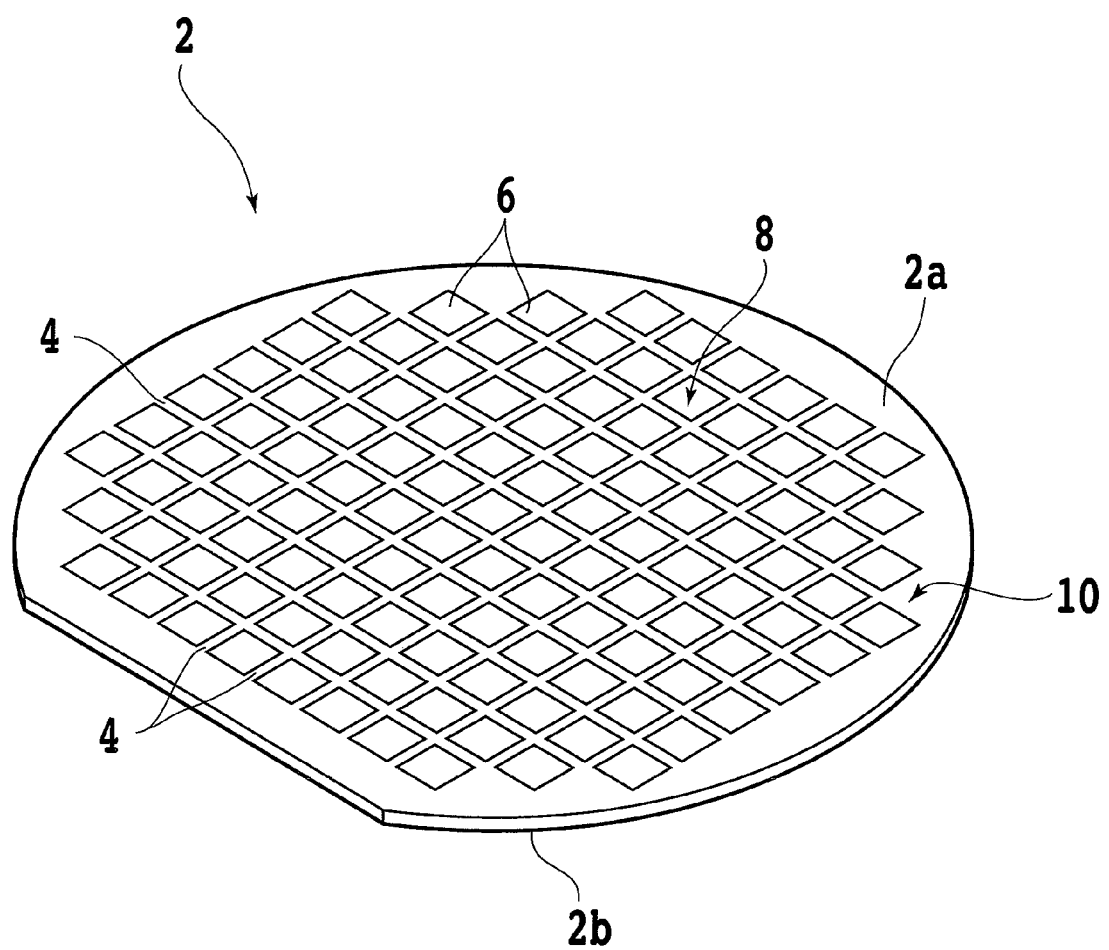
FIG. 1 is a perspective view of a semiconductor wafer as viewed from the front side thereof.

A preferred embodiment of the semiconductor chip fabrication method according to the present invention will now be described in detail with reference to the attached drawings. FIG. 1 is a perspective view of a semiconductor wafer 2 as viewed from the front side 2a thereof. For example, the semiconductor wafer 2 is a silicon wafer having a thickness of 300 μm. The front side 2a of the semiconductor wafer 2 is formed with a plurality of crossing streets (division lines) 4 to thereby define a plurality of partitioned regions arranged like a matrix, and a plurality of devices 6 such as ICs and LSIs are formed in these partitioned regions.

Figure 2:
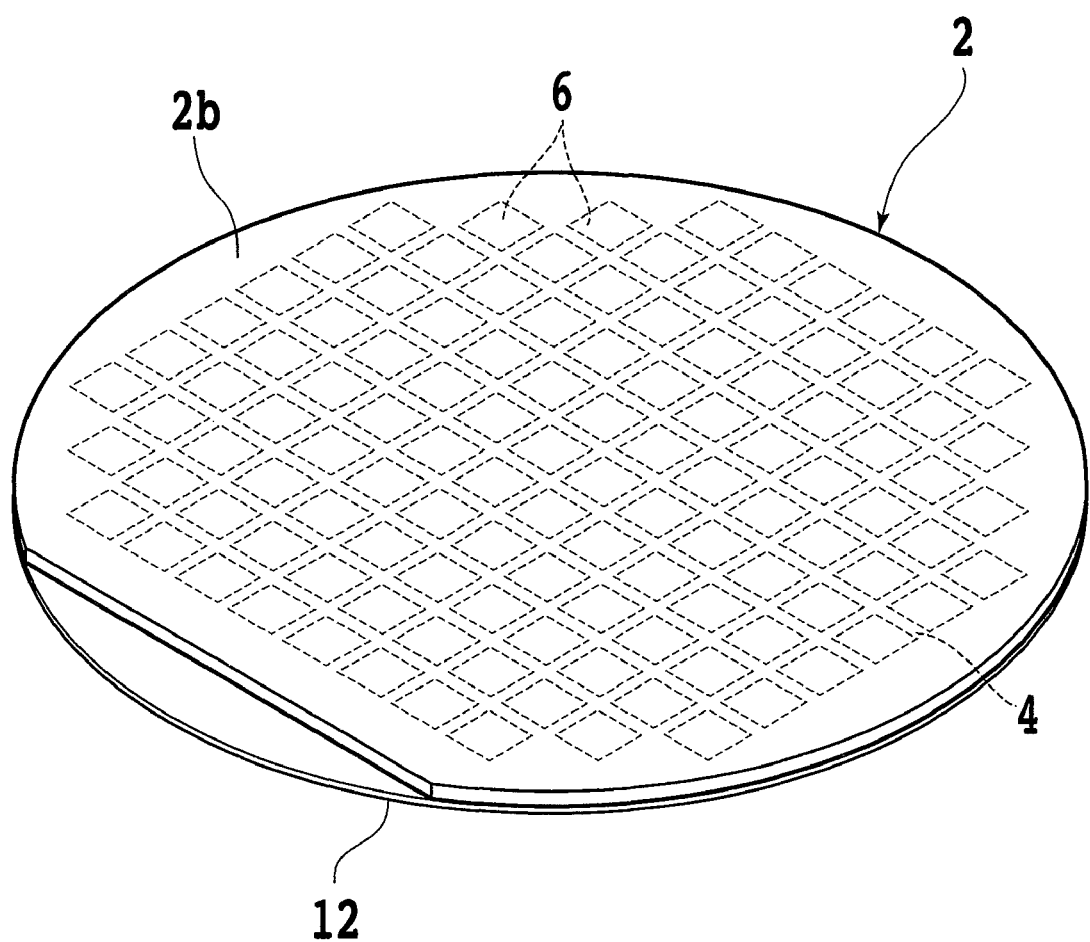
FIG. 2 is a perspective view of the semiconductor wafer as viewed from the back side thereof in the condition where a protective tape is attached to the front side of the semiconductor wafer.

The semiconductor wafer 2 includes a device area 8 where the devices 6 are formed and a marginal area 10 surrounding the device area 8. As shown in FIG. 2, a protective tape 12 is attached to the front side 2a of the semiconductor wafer 2 in a protective tape attaching step. Accordingly, the front side 2a of the semiconductor wafer 2 is protected by the protective tape 12, and the back side 2b of the semiconductor wafer 2 is exposed as shown in FIG. 2. Prior to dividing the semiconductor wafer 2 along the streets 4 to obtain the individual devices (chips) 6, the back side 2b of the semiconductor wafer 2 is ground to reduce the thickness of the semiconductor wafer 2 to a predetermined value.

In recent years, it has been desired to reduce the thickness of a semiconductor wafer to a smaller value, e.g., about 50 μm, to attain a further reduction in size and weight of electric equipment. Such a semiconductor wafer having a reduced thickness obtained by grinding is difficult to handle, causing a possibility of breakage of the wafer during transportation or the like. To cope with this problem, a semiconductor wafer 2' shown in FIGS. 3A and 3B has been proposed. The back side of the semiconductor wafer 2' is ground at only a central portion corresponding to the device area 8 to thereby form a circular recess 14, so that a ringlike projection (ringlike reinforcing portion) 16 is formed on the back side of the semiconductor wafer 2' at a peripheral portion corresponding to the marginal area 10 surrounding the device area 8.

Figure 4:
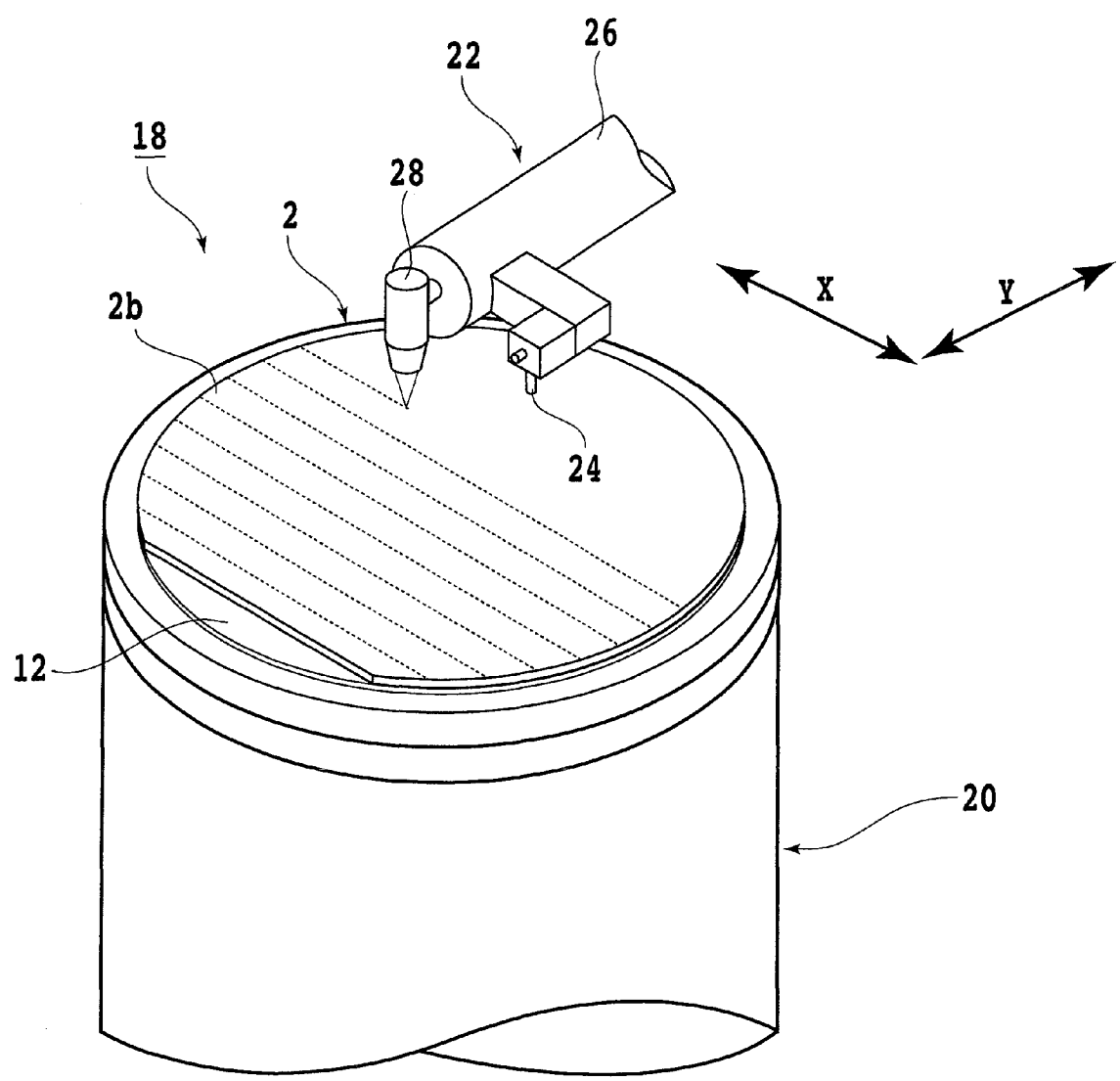
FIG. 4 is a perspective view showing an essential part of a laser processing apparatus for performing a modified layer forming step.

Referring now to FIG. 4, there is shown a schematic perspective view of a laser processing apparatus 18 for forming a modified layer inside the semiconductor wafer 2 along each street 4. The laser processing apparatus 18 includes a chuck table 20 for holding the semiconductor wafer 2, laser beam applying means 22 for applying a laser beam to the semiconductor wafer 2 held on the chuck table 20, and imaging means 24 such as a CCD (Charge Coupled Device) camera for imaging the semiconductor wafer 2 held on the chuck table 20.

The chuck table 20 is so configured as to hold the semiconductor wafer 2 by using suction means (not shown). The chuck table 20 is movable both in a feeding direction shown by an arrow X in FIG. 4 and in an indexing direction shown by an arrow Y in FIG. 4 by means of a moving mechanism (not shown). The laser beam applying means 22 includes a cylindrical casing 26 extending in a substantially horizontal direction. Although not shown, the casing 26 contains pulsed laser beam oscillating means including a pulsed laser beam oscillator and repetition frequency setting means. Examples of the pulsed laser beam oscillator include a YAG laser oscillator and a YVO4 laser oscillator. The laser beam applying means 22 further includes focusing means 28 mounted on the front end of the casing 26 for focusing the pulsed laser beam oscillated from the pulsed laser beam oscillating means.

The imaging means 24 includes an ordinary imaging device (CCD) for imaging the semiconductor wafer 2 by using visible light, infrared light applying means for applying infrared light to the semiconductor wafer 2, and another imaging device (infrared CCD) for outputting an electrical signal corresponding to the infrared light. An image signal output from the imaging means 24 is transmitted to control means (not shown).

A modified layer forming step for forming a modified layer in the semiconductor wafer 2 by using the laser processing apparatus 18 shown in FIG. 4 will now be described. First, the semiconductor wafer 2 is placed on the chuck table 20 of the laser processing apparatus 18 in the condition where the protective tape 12 is in contact with the chuck table 20 as shown in FIG. 4. Thereafter, the suction means (not shown) is operated to hold the semiconductor wafer 2 on the chuck table 20 by vacuum. Accordingly, the back side 2b of the semiconductor wafer 2 held on the chuck table 20 is oriented upward as shown in FIG. 4.

The chuck table 20 thus holding the semiconductor wafer 2 is moved to a position directly below the imaging means 24 by the moving mechanism (not shown). In this condition, an alignment operation is performed by the imaging means 24 and the control means (not shown) to detect a processed area of the semiconductor wafer 2 to be laser-processed. More specifically, the imaging means 24 and the control means perform image processing such as pattern matching for making the alignment of the first streets 4 extending in a predetermined direction on the semiconductor wafer 2 and the focusing means 28 of the laser beam applying means 22 for applying the laser beam to the semiconductor wafer 2 along the first streets 4, thus performing the alignment of a laser beam applying position.

Similarly, the alignment of a laser beam applying position is performed for the second streets 4 extending in a direction perpendicular to the above-mentioned predetermined direction of the first streets 4 on the semiconductor wafer 2. Although the front side 2a of the semiconductor wafer 2 on which the first and second streets 4 are formed is oriented downward as shown in FIG. 4, the first and second streets 4 can be imaged from the back side 2b by the infrared CCD of the imaging means 24.

Figure 5A:
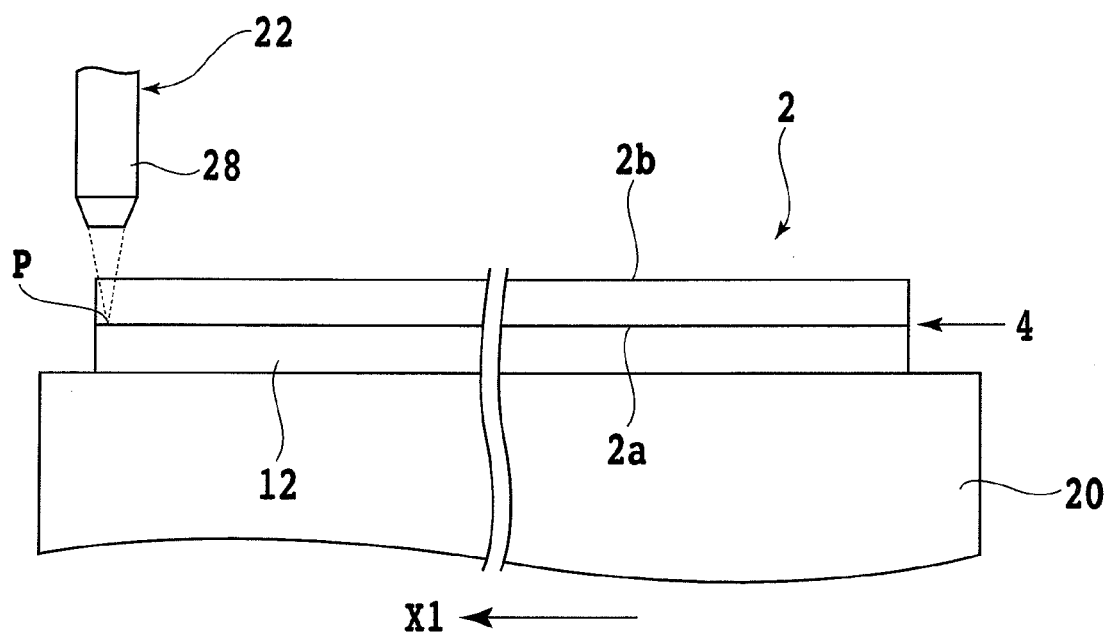
FIGS. 5A and 5B are sectional side views for illustrating the modified layer forming step using the laser processing apparatus shown in FIG. 4.

After performing the alignment operation mentioned above, the chuck table 20 is moved to a laser beam applying area where the focusing means 28 of the laser beam applying means 22 is located as shown in FIG. 5A, thereby positioning one end of a predetermined one of the first streets 4 directly below the focusing means 28 of the laser beam applying means 22. In this condition, a pulsed laser beam having a transmission wavelength to the semiconductor wafer 2 is applied from the focusing means 28 to the semiconductor wafer 2 along the predetermined first street 4, and the chuck table 20 is moved in a direction shown by an arrow X1 in FIG. 5A at a predetermined feed speed.

Figure 5B:
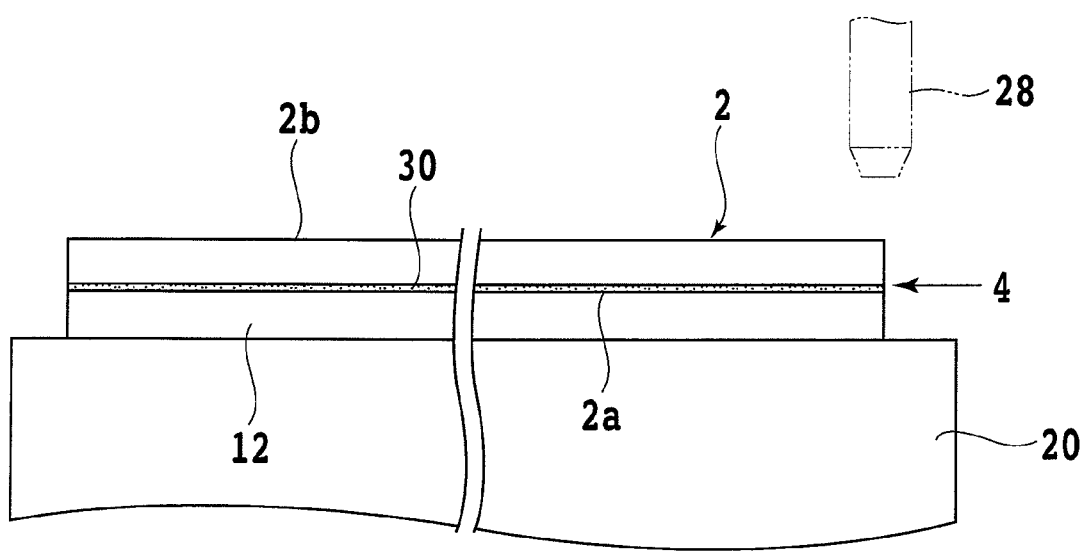

When the laser beam applying position of the focusing means 28 reaches the other end of the predetermined first street 4 shown in FIG. 5B, the application of the pulsed laser beam from the focusing means 28 is stopped and the movement of the chuck table 20 is also stopped. As shown in FIG. 5A, the focual point P of the pulsed laser beam is set near the front side 2a (lower surface as viewed in FIG. 5A) of the semiconductor wafer 2, so that a modified layer 30 is formed in the semiconductor wafer 2 so as to be exposed to the front side 2a of the semiconductor wafer 2. This modified layer 30 is formed as a melt rehardened layer.

For example, this modified layer forming step is performed under the following processing conditions.

Figure 6:
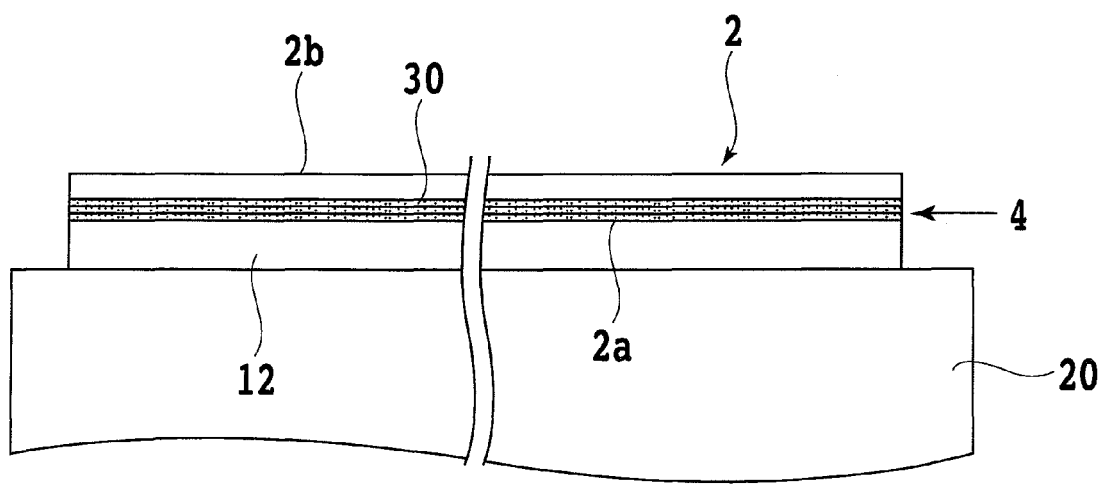
FIG. 6 is a sectional side view for illustrating a modification in which a plurality of modified layers having a multilayer structure in the semiconductor wafer.

Light source: LD pumped Q-switched Nd: YVO4 pulsed laser
  Wavelength: 1064 nm
  Repetition frequency: 100 KHz
  Pulse output: 10 µJ
  Focused spot diameter: φ1 µm
  Work feed speed: 100 mm/sec In the case that the thickness of the semiconductor wafer 2 is relatively large, the modified layer forming step mentioned above is repeated plural times in the condition where the focal point P is stepwise changed in depth to thereby form a plurality of modified layers 30 having a multilayer structure, as shown in FIG. 6. For example, the thickness of the modified layer 30 formed by one cycle of the modified layer forming step under the above processing conditions is about 50 µm. Accordingly, by repeating the modified layer forming step three times, a three-layered modified layer having a total thickness of 150 µm can be formed. As a modification, in the case that the semiconductor wafer 2 has a thickness of 300 µm, a six-layered modified layer having a total thickness of 300 µm may be formed over the thickness of the semiconductor wafer 2 along each street 4. As another modification, the modified layer 30 may be formed so as not to be exposed to the front side 2a and the back side 2b of the semiconductor wafer 2.

After performing the modified layer forming step along all of the first streets 4 on the semiconductor wafer 2, the chuck table 20 is rotated 90° to similarly perform the modified layer forming step along all of the second streets 4 perpendicular to the first streets 4. After thus finishing the modified layer forming step along all of the first and second streets 4, a metal film such as a gold, silver, or titanium film is deposited on the back side 2b of the semiconductor wafer 2 (metal film deposition step).

Figure 7:
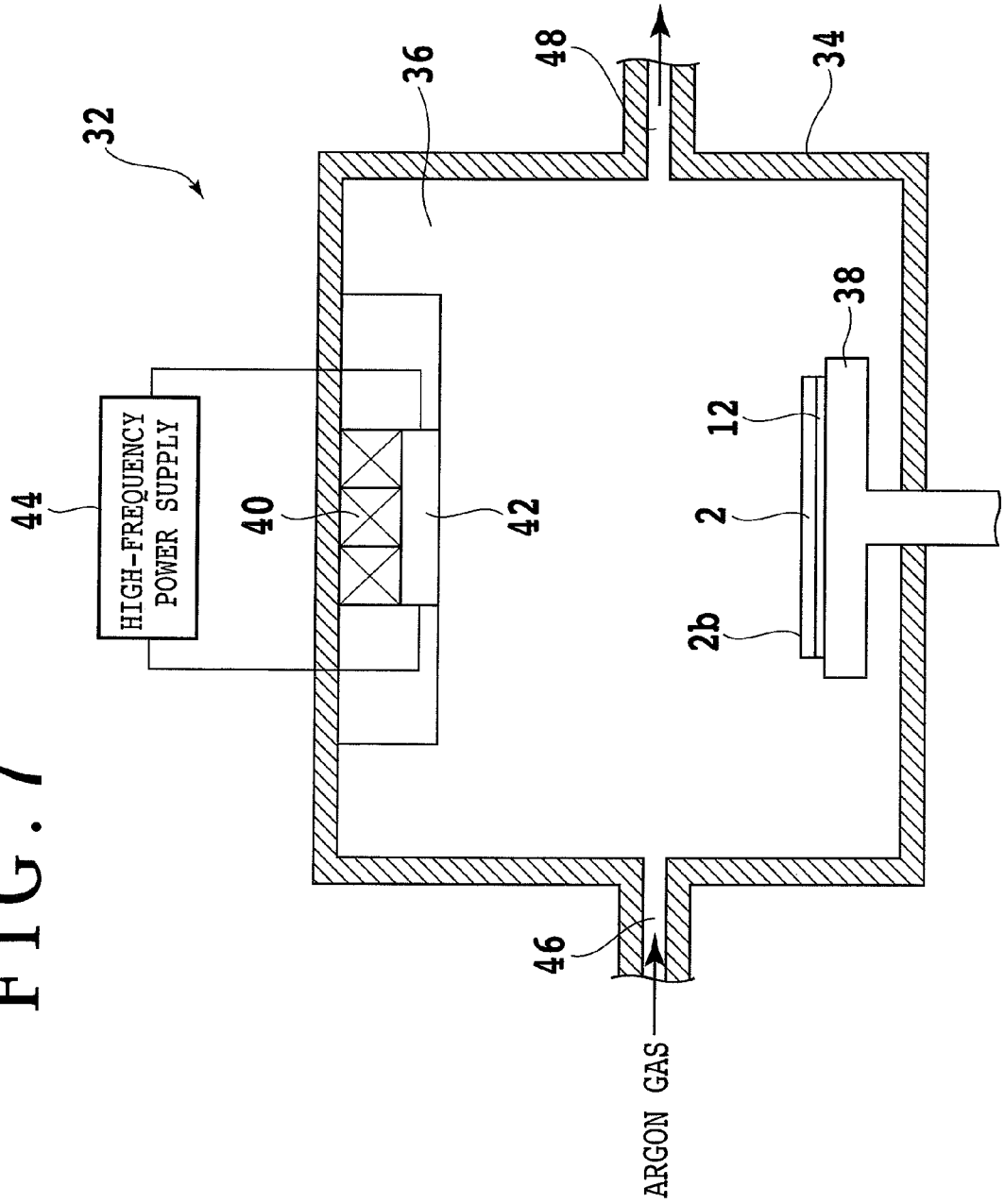
FIG. 7 is a schematic sectional view of a low-pressure film deposition apparatus.

The metal film deposition step is performed by using a low-pressure film deposition apparatus 32 shown in FIG. 7, for example. The low-pressure film deposition apparatus 32 has a chamber 36 defined by a housing 34 and a holding member 38 provided in the chamber 36 for electrostatically holding the semiconductor wafer 2. A sputter source 42 formed of metal is provided in the chamber 36 at an upper position opposed to the holding member 38 so as to be supported by an exciting member 40. A high-frequency power supply 44 is connected to the sputter source 42. A gas inlet 46 for introducing a sputter gas such as argon gas into the chamber 36 is formed through one side wall portion of the housing 34, and an evacuation hole 48 communicating with a low-pressure source is formed through another side wall portion of the housing 34.

The semiconductor wafer 2 is electrostatically held on the holding member 38 in the condition where the protective tape 12 attached to the front side 2a of the semiconductor wafer 2 is placed on the holding member 38, so that the back side 2b of the semiconductor wafer 2 is opposed to the sputter source 42. A high-frequency power having a frequency of about 40 kHz is applied from the high-frequency power supply 44 to the sputter source 42 magnetized by the exciting member 40, and the chamber 36 is evacuated from the evacuation hole 48 to a low pressure of about $10^{-2}$ to $10^{-4}$ Pa, thus attaining a low-pressure environment in the chamber 36. Thereafter, an argon gas is introduced from the gas inlet 46 into the chamber 36 to generate a plasma.

As a result, argon atoms in the plasma collide with the sputter source 42 to eject the particles from the surface of the sputter source 42. The ejected particles are deposited to the back side 2b of the semiconductor wafer 2 to form a metal film having a predetermined thickness, e.g., about 30 to 60 nm on the back side 2b of the semiconductor wafer 2. Any other film deposition methods such as evaporation and CVD (Chemical Vapor Deposition) may be used in the metal film deposition step.

Figure 8:
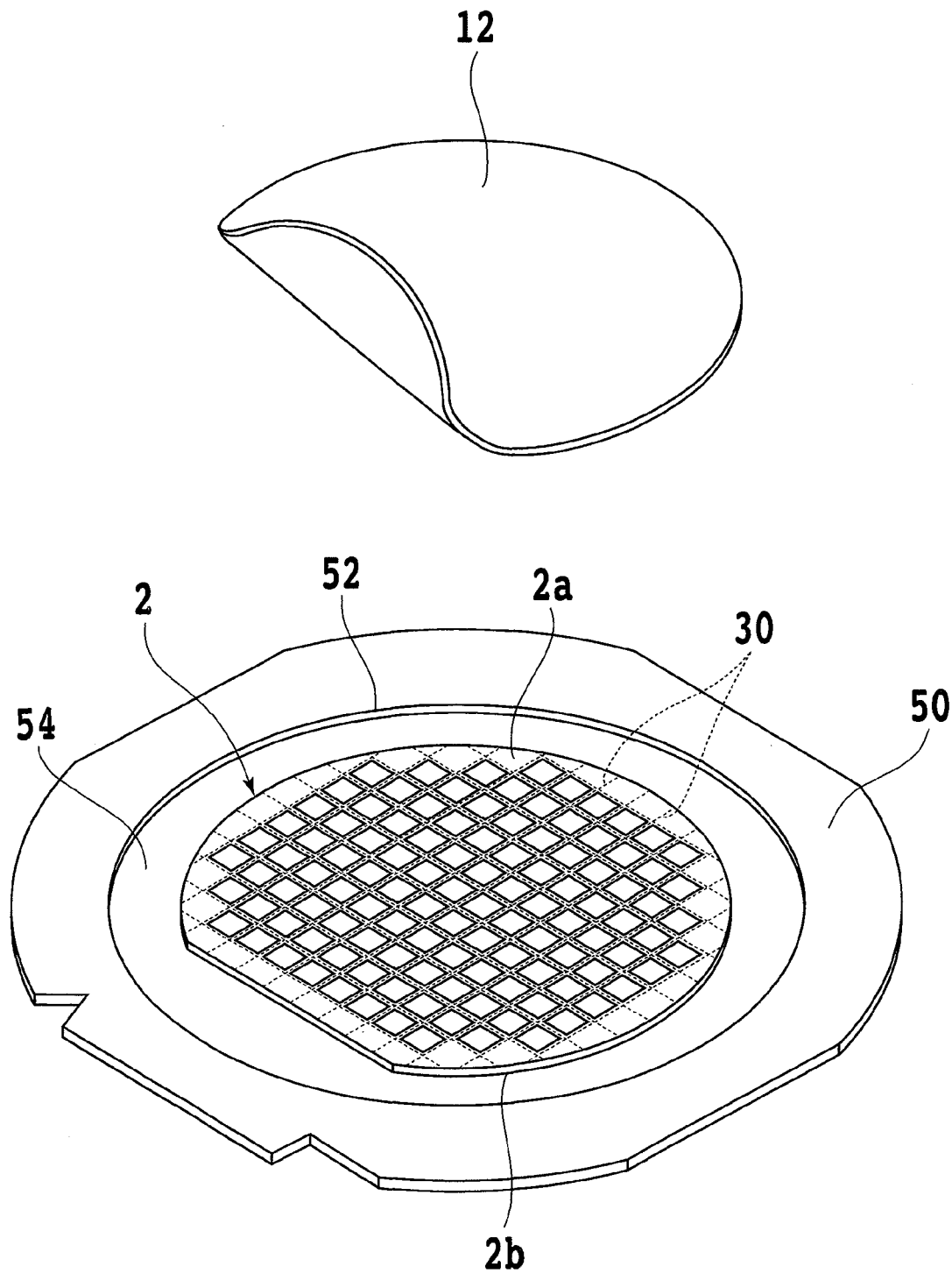
FIG. 8 is a perspective view of the semiconductor wafer in the condition where the semiconductor wafer is attached to an adhesive tape supported to an annular frame.

After coating the back side 2b of the semiconductor wafer 2 with the metal film as mentioned above, the semiconductor wafer 2 is attached to an adhesive tape 54 supported to an annular frame 50 as shown in FIG. 8 (semiconductor wafer attaching step). More specifically, the adhesive tape 54 is supported at its outer circumferential portion to the annular frame 50 in such a manner as to cover an opening 52 of the annular frame 50. The back side 2b coated with the metal film is attached to the adhesive tape 54 in the condition where the front side 2a of the semiconductor wafer 2 is oriented upward. Thereafter, the protective tape 12 is peeled off from the front side 2a of the semiconductor wafer 2.

Figure 9:
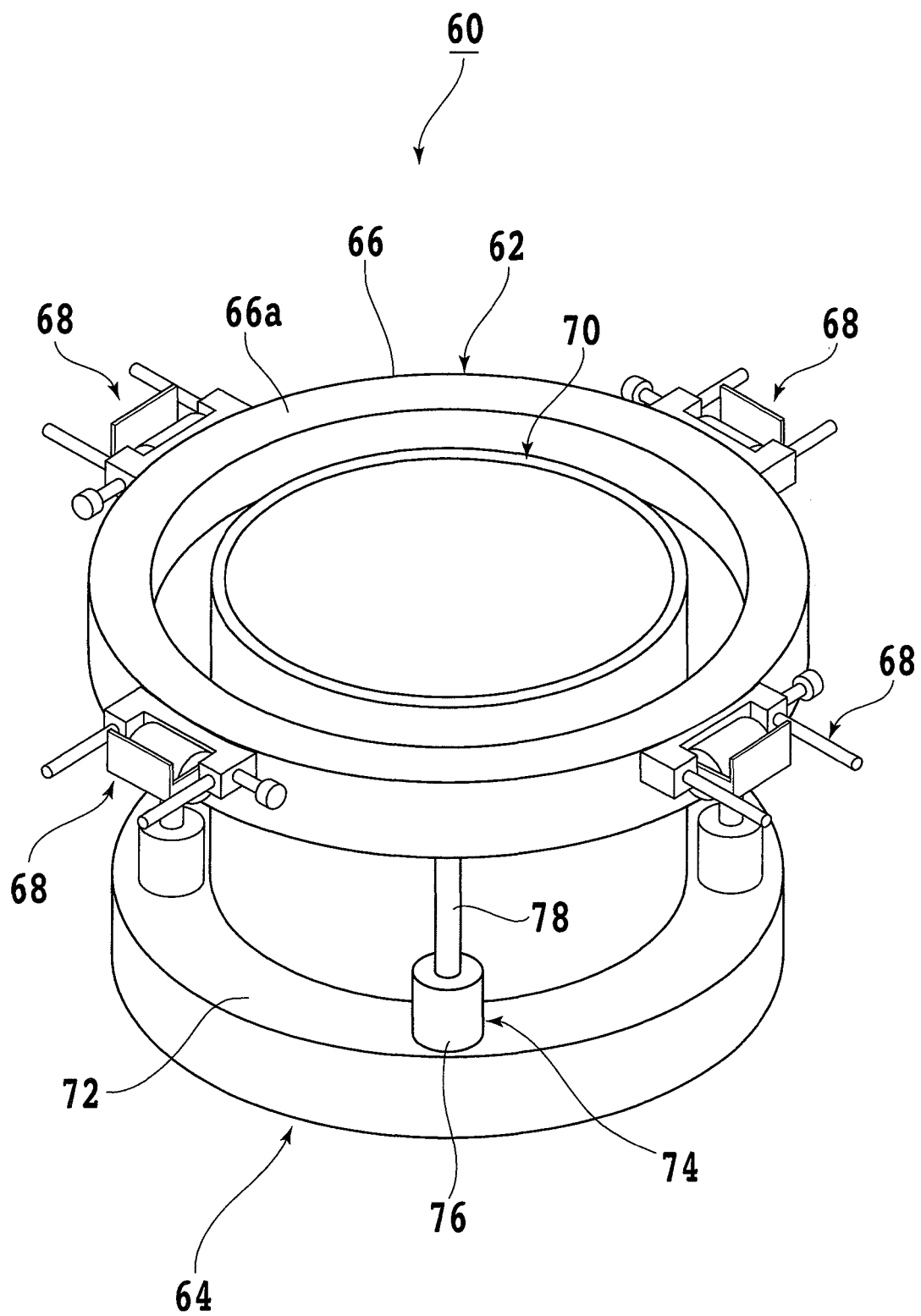
FIG. 9 is a perspective view of a dividing apparatus.

After performing the semiconductor wafer attaching step mentioned above, a semiconductor wafer dividing step is performed by using a dividing apparatus 60 shown in FIG. 9, wherein the semiconductor wafer 2 is divided into the individual chips or devices 6 along all the streets 4 along which the modified layers 30 are formed. As shown in FIG. 9, the dividing apparatus 60 includes frame holding means 62 for holding the annular frame 50 and tape expanding means 64 for expanding the adhesive tape 54 supported to the annular frame 50 held by the frame holding means 62.

The frame holding means 62 includes an annular frame holding member 66 and a plurality of clamps 68 as fixing means provided on the outer circumference of the frame holding member 66. The upper surface of the frame holding member 66 functions as a mounting surface 66a for mounting the annular frame 50 thereon. The annular frame 50 mounted on the mounting surface 66a is fixed to the frame holding member 66 by the clamps 68. The frame holding means 62 is supported by the tape expanding means 64 so as to be vertically movable.

The tape expanding means 64 includes an expanding drum 70 provided inside of the annular frame holding member 66. The expanding drum 70 has an outer diameter smaller than the inner diameter of the annular frame 50 and an inner diameter larger than the outer diameter of the semiconductor wafer 2 attached to the adhesive tape 54 supported to the annular frame 50. The expanding drum 70 has a supporting flange 72 integrally formed at the lower end of the drum 70. The tape expanding means 64 further includes driving means 74 for vertically moving the annular frame holding member 66.

Figure 10A:
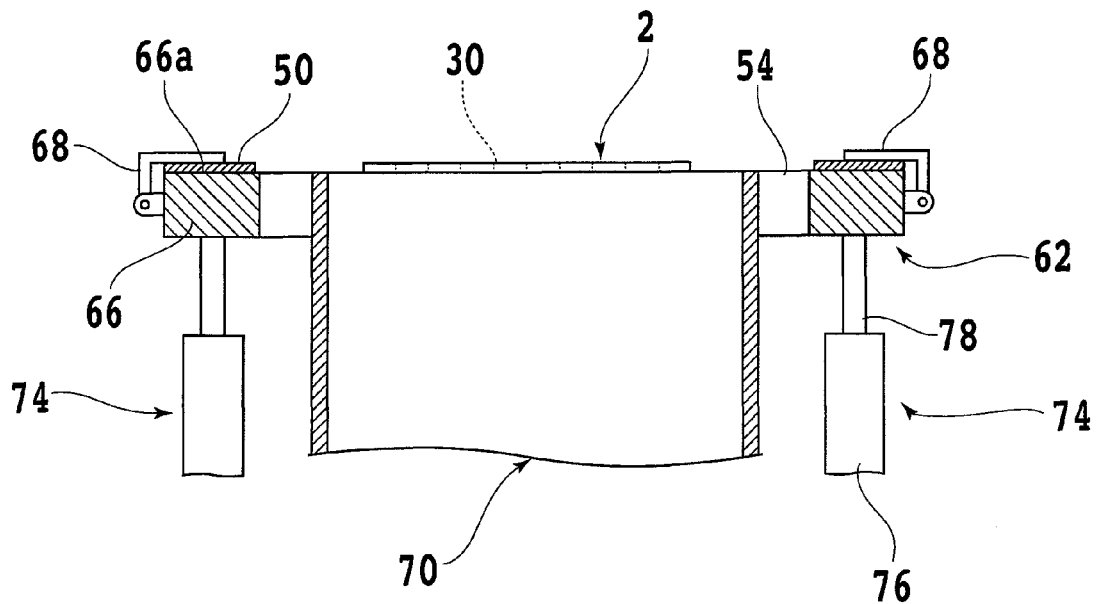
FIGS. 10A and 10B are sectional views for illustrating a wafer dividing step.

The driving means 74 is composed of a plurality of air cylinders 76 provided on the supporting flange 72. Each air cylinder 76 is provided with a piston rod 78 connected to the lower surface of the annular frame holding member 66. The driving means 74 composed of the plural air cylinders 76 functions to vertically move the annular frame holding member 66 so as to selectively take a reference position where the mounting surface 66a is substantially equal in height to the upper end of the expanding drum 70 as shown in FIG. 10A and an expansion position where the mounting surface 66a is lower in height than the upper end of the expanding drum 70 by a predetermined amount as shown in FIG. 10B.

The semiconductor wafer dividing step using the dividing apparatus 60 will now be described with reference to FIGS. 10A and 10B. As shown in FIG. 10A, the annular frame 50 supporting the semiconductor wafer 2 through the adhesive tape 54 is mounted on the mounting surface 66a of the frame holding member 66 and fixed to the frame holding member 66 by the clamps 68. At this time, the frame holding member 66 is set at the reference position where the height of the mounting surface 66a is substantially the same as that of the upper end of the expanding drum 70.

Figure 10B:
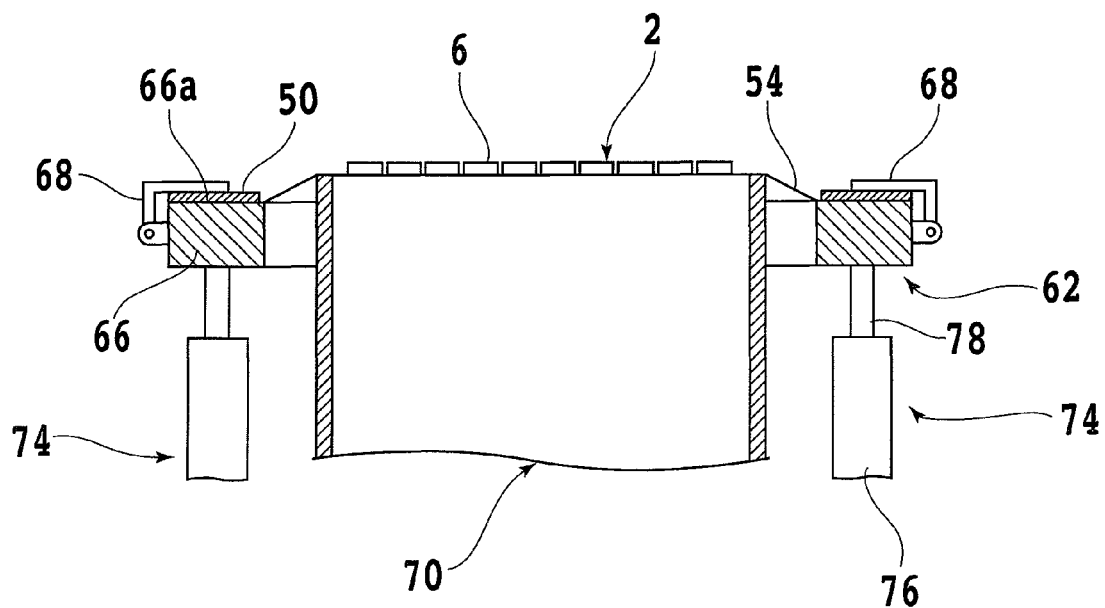

Thereafter, the air cylinders 76 are driven to lower the frame holding member 66 to the expansion position shown in FIG. 10B. Accordingly, the annular frame 50 fixed to the mounting surface 66a of the frame holding member 66 is also lowered, so that the adhesive tape 54 supported to the annular frame 50 comes into abutment against the upper end of the expanding drum 70 and is expanded mainly in the radial direction of the expanding drum 70 as shown in FIG. 10B. As a result, a tensile force is radically applied to the semiconductor wafer 2 attached to the adhesive tape 54. When a tensile force is radically applied to the semiconductor wafer 2, the semiconductor wafer 2 is broken along the modified layers 30 formed along all of the streets 4 because the modified layers 30 are low in strength, thereby dividing the semiconductor wafer 2 into the invidual semiconductor chips (devices) 6.

Figure 3A:
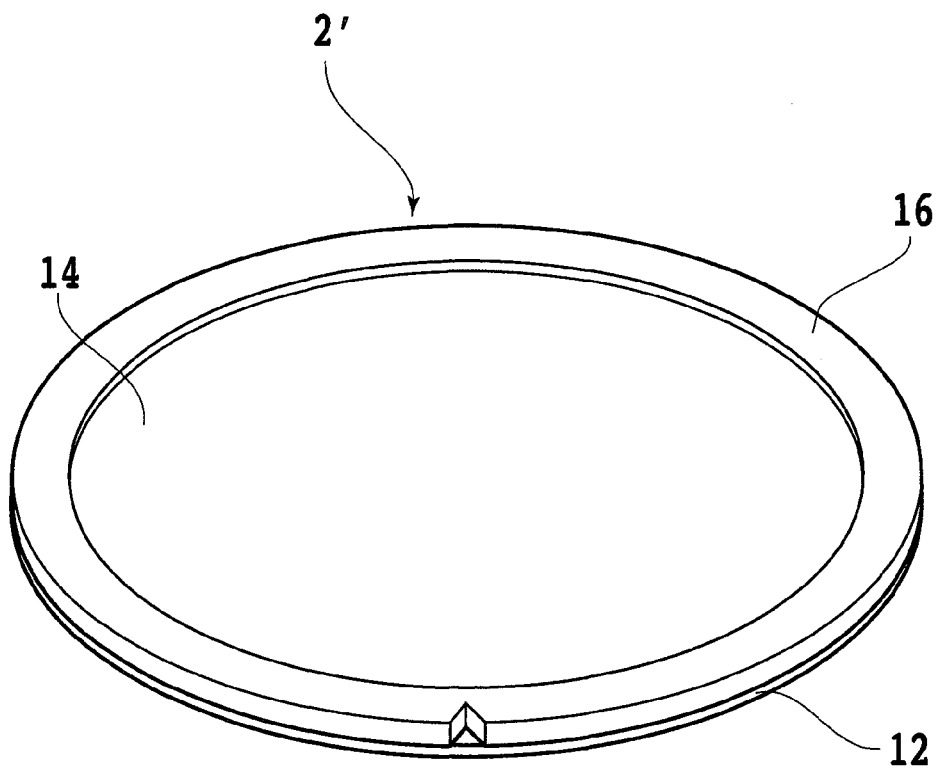
FIG. 3A is a perspective view of another semiconductor wafer having a ringlike projection formed on the back side in a marginal area by grinding a central portion of the back side corresponding to a device area.
Figure 3B:
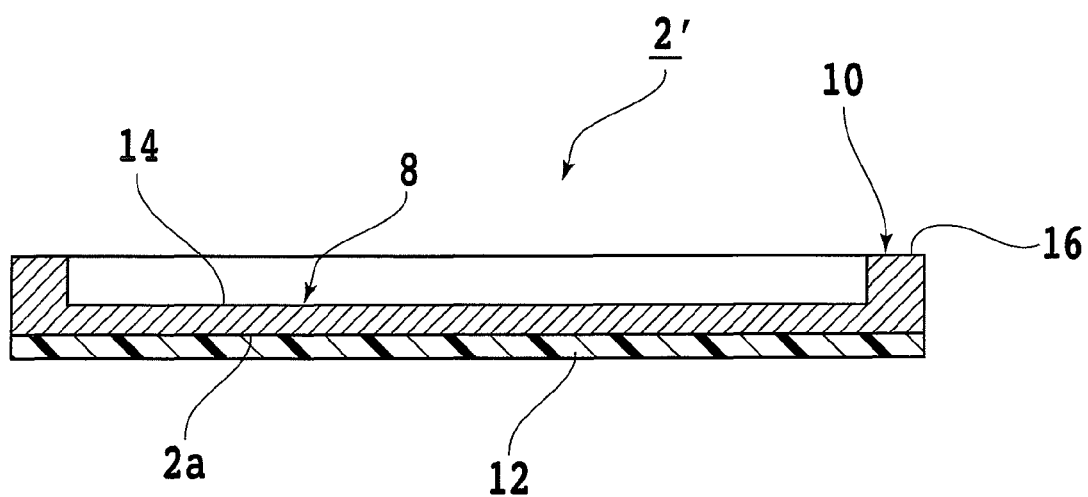
FIG. 3B is a vertical sectional view of the semiconductor wafer shown in FIG. 3A.

While the semiconductor chip fabrication method according to the present invention has been described in the case of using the ordinary semiconductor wafer 2, it should be noted that this method is applicable also to the case of using the semiconductor wafer 2' having the ringlike projection 16 shown in FIGS. 3A and 3B.

Various modifications of the semiconductor wafer dividing step may be made in the present invention. For example, the semiconductor wafer 2 attached to the adhesive tape 54 may be placed on a soft rubber sheet, and the upper surface of the semiconductor wafer 2 may be pressed by a roller to thereby break the semiconductor wafer 2 along the modified layers 30 formed along all of the streets 4. As another example, a pressure member may be applied along all of the streets 4 along which the modified layers 30 are formed.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor chip fabrication method for dividing a semiconductor wafer into individual semiconductor chips, said semiconductor wafer having a device area and a marginal area surrounding said device area, said device area being composed of a plurality of regions partitioned by a plurality of crossing streets formed on the front side of said semiconductor wafer, wherein said semiconductor chips as devices are respectively formed in said plurality of regions of said device area, said semiconductor chip fabrication method comprising:
    a modified layer forming step of applying a laser beam having a transmission wavelength to said semiconductor wafer from the back side of said semiconductor wafer along said streets so that a focal point of said laser beam is set inside said semiconductor wafer, thereby forming a modified layer in said semiconductor wafer along each street;
    a metal film deposition step of depositing a metal film on the back side of said semiconductor wafer after said modified layer forming step;
    a semiconductor wafer attaching step of attaching said semiconductor wafer to an adhesive tape supported to an annular frame; and
    a semiconductor wafer dividing step of applying an external force to said semiconductor wafer in the condition where said semiconductor wafer is attached to said adhesive tape to thereby divide said semiconductor wafer with said metal film into said individual semiconductor chips along said modified layer formed along each street.

2. The semiconductor chip fabrication method according to claim 1, wherein said semiconductor wafer dividing step is performed by expanding said adhesive tape to thereby apply a tensile force to said semiconductor wafer attached to said adhesive tape, so that said semiconductor wafer is divided along said modified layer.

3. The semiconductor chip fabrication method according to claim 1, further comprising:
    the step of grinding the back side of said semiconductor wafer at a central portion corresponding to said device area prior to said modified layer forming step, thereby forming a ring like projection corresponding to said marginal area on the back side of said semiconductor wafer.

4. The semiconductor chip fabrication method according to claim 3, further comprising:
    the step of removing said ring like projection of said semiconductor wafer after said metal film deposition step and before said semiconductor wafer dividing step.

* * * * *